United States Patent
Kim (10) Patent No.: US 7,518,308 B2
(45) Date of Patent: Apr. 14, 2009

(54) ACTIVE MATRIX ELECTROLUMINESCENCE DEVICE AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 123 days.

(21) Appl. No.: 10/902,066

(22) Filed: Jul. 30, 2004

(65) Prior Publication Data

US 2005/0052126 A1    Mar. 10, 2005

(30) Foreign Application Priority Data

Sep. 8, 2003    (KR) ...................... 10-2003-0062622

(51) Int. Cl.
*H05B 33/06* (2006.01)

(52) U.S. Cl. ...................... 313/506; 313/500

(58) Field of Classification Search .................. 313/500, 313/504, 506
See application file for complete search history.

(56) References Cited

U.S. PATENT DOCUMENTS

| | | | | |
|---|---|---|---|---|
| 6,911,960 B1 * | 6/2005 | Yokoyama | ...................... | 345/76 |
| 6,936,846 B2 * | 8/2005 | Koyama et al. | ................ | 257/71 |
| 7,057,208 B2 * | 6/2006 | Akimoto et al. | ................ | 257/59 |

| | | | | |
|---|---|---|---|---|
| 2002/0140646 A1 | 10/2002 | Sato et al. | ...................... | 345/82 |
| 2003/0089991 A1 | 5/2003 | Yamazaki et al. | ........... | 257/759 |

FOREIGN PATENT DOCUMENTS

| | | |
|---|---|---|
| CN | 1327270 | 12/2001 |
| CN | 1429055 | 7/2003 |
| JP | 2000-357584 | 12/2000 |
| KR | 10-2002-0078535 | 10/2002 |
| KR | 10-2003-0034325 | 5/2003 |

OTHER PUBLICATIONS

European Search Report dated Apr. 28, 2006.
Chinese Office Action dated Apr. 25, 2008.
Office Action issued by the Korean Intellectual Property Office, Sep. 27, 2005.

* cited by examiner

*Primary Examiner*—Karabi Guharay
(74) *Attorney, Agent, or Firm*—Ked & Associates LLP

(57) ABSTRACT

An active matrix electroluminescence device and a method for fabricating the same for enhancing electrical characteristics of a wire are disclosed. The method includes forming a wire on a non-emissive area of a substrate, and forming transistors on an emissive area of the substrate, forming an insulating layer on the substrate, the wire, and the transistors, and selectively removing the insulating layer, so as to expose the wire, forming a first electrode on the insulating layer in the emissive area, forming an electroluminous layer on the first electrode, and forming a second electrode on the electroluminous layer and the wire.

17 Claims, 7 Drawing Sheets

ACTIVE MATRIX ELECTROLUMINESCENCE DEVICE AND METHOD FOR FABRICATING THE SAME

CROSS-REFERENCE TO RELATED APPLICATIONS

This application claims the benefit of Korean Application No. P2003-062622, filed on Sep. 8, 2003, which is hereby incorporated by reference as if fully set forth herein.

BACKGROUND OF THE INVENTION

1. Field of the Invention

The present invention relates to an organic electroluminescence device, and more particularly, to an active matrix electroluminescence device and a method for fabricating the same. Although the present invention is suitable for a wide scope of applications, it is particularly suitable for enhancing an electrical characteristic of wires outside of an emissive area of the device.

2. Discussion of the Related Art

An electroluminescence device is being viewed as a next generation flat display device for its characteristics of a wide viewing angle, a high aperture ratio, and a high chromaticity. More specifically, in an organic electroluminescence (EL) device, when an electric charge is injected into an organic luminous layer formed between a hole injection electrode and an electron injection electrode, the electron and the hole are paired to each other generating an exciton, the excited state of which falls to a ground state, thereby emitting light. Thus, the organic electroluminescence device (ELD) can be operated at a lower voltage, as compared to other display devices.

Depending upon the driving method, the organic ELD can be classified into a passivation ELD and an active matrix ELD. The passivation ELD is formed of a transparent electrode on a transparent substrate, an organic electroluminous layer on the transparent electrode, and a cathode electrode on the organic electroluminous layer. The active matrix ELD is formed of a plurality of scan lines and data lines defining a pixel area on a substrate, a switching device electrically connecting the scan lines and the data lines and controlling the electroluminescence device, a transparent electrode (i.e., anode) electrically connected to the switching device and formed in the pixel area on the substrate, an organic electroluminous layer on the transparent electrode, and a metal electrode (i.e., cathode) on the organic electroluminous layer. Unlike the passivation ELD, the active matrix ELD further includes the switching device, which is a thin film transistor (TFT).

In the related art active matrix electroluminescence device, the wires and electrodes outside of emissive area are not covered by a protective layer, but mostly covered by an indium tin oxide (ITO) layer. For example, an ITO layer, which is a pixel electrode, is formed on the wire so as to be in contact with the common electrode (i.e., cathode). Subsequently, the common electrode is formed on the ITO layer.

In the emissive layer, since an organic electroluminous layer is formed between the pixel electrode and the common electrode, an interfacial characteristic between the pixel electrode and the common electrode does not change. However, since the pixel electrode and the common electrode formed on the wires are in direct contact with each other, the interfacial characteristic between the two electrodes change. Therefore, the current flow between the wires and the common electrode is deteriorated, thereby lowering product reliability.

SUMMARY OF THE INVENTION

Accordingly, the present invention is directed to an active matrix electroluminescence device and a method for fabricating the same that substantially obviate one or more problems due to limitations and disadvantages of the related art.

An object of the present invention is to provide an active matrix electroluminescence device and method for fabricating the same that can enhance an electrical characteristic of wires outside of an emissive area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an active matrix electroluminescence device includes transistors formed on an emissive area of a substrate, a wire formed on a non-emissive area of the substrate, an insulating layer formed on the substrate and the transistors, and exposing a portion of the wire, a first electrode formed on the insulating layer in the emissive area, an electroluminous layer formed on the first electrode, and a second electrode formed on the electroluminous layer and the wire.

The wire is connected to a pad part, and the wire is formed of at least one of molybdenum (Mo), aluminum (Al), and neodymium (Nd).

The insulating layer includes a trench for exposing a portion of the wire on the non-emissive area.

The first electrode is connected to the transistor of the emissive area through a contact hole penetrating the insulating layer and is formed of indium tin oxide (ITO). The second electrode is formed of one of aluminum (Al) and an aluminum alloy.

Also, the active matrix electroluminescence device further includes a metal layer formed on the wire. Herein, the metal layer is formed of at least one of chrome (Cr), copper (Cu), tungsten (W), gold (Au), nickel (Ni), silver (Ag), titanium (Ti), and tantalum (Ta).

In another aspect of the present invention, a method for fabricating an active matrix luminescence device includes forming a wire on a non-emissive area of a substrate, and forming transistors on an emissive area of the substrate, forming an insulating layer on the substrate, the wire, and the transistors, and selectively removing the insulating layer, so as to expose the wire, forming a first electrode on the insulating layer in the emissive area, forming an electroluminous layer on the first electrode, and forming a second electrode on the electroluminous layer and the wire.

Herein, the wire and source and drain electrodes of the transistors are formed simultaneously.

And, a contact hole exposing a portion of the transistors is formed, when selectively removing the insulating layer so as to expose a portion of the wire.

The method for fabricating the active matrix electroluminescence device further includes forming a metal layer on the wire, after selectively removing the insulating layer so as to expose the wire.

And, the forming a first electrode on the insulating layer in the emissive area includes depositing an indium tin oxide (ITO) layer on an entire surface of the insulating layer, and selectively removing the indium tin oxide layer in the non-emissive area by using an etchant non-corrosive to the wire.

In a further aspect of the present invention, a method for fabricating an active matrix electroluminescence device includes forming a wire on a non-emissive area of a substrate, and forming transistors on an emissive area of the substrate, forming an insulating layer on the substrate, the wire, and the transistors, and selectively removing the insulating layer, so as to expose the wire and source and drain electrodes of the transistors, forming a metal layer on the wire, and forming electrode lines connected to each of the source and drain electrodes, forming a protective layer on an entire surface of the insulating layer and the electrode lines, and selectively removing the protective layer so as to expose the metal layer and the electrode line, forming a first electrode on the insulating layer in the emissive area, forming an electroluminous layer on the first electrode, and forming a second electrode on the electroluminous layer and the wire.

Herein, the wire and source and drain electrodes of the transistors are formed simultaneously.

And, the metal layer and the electrode lines are formed of the same material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
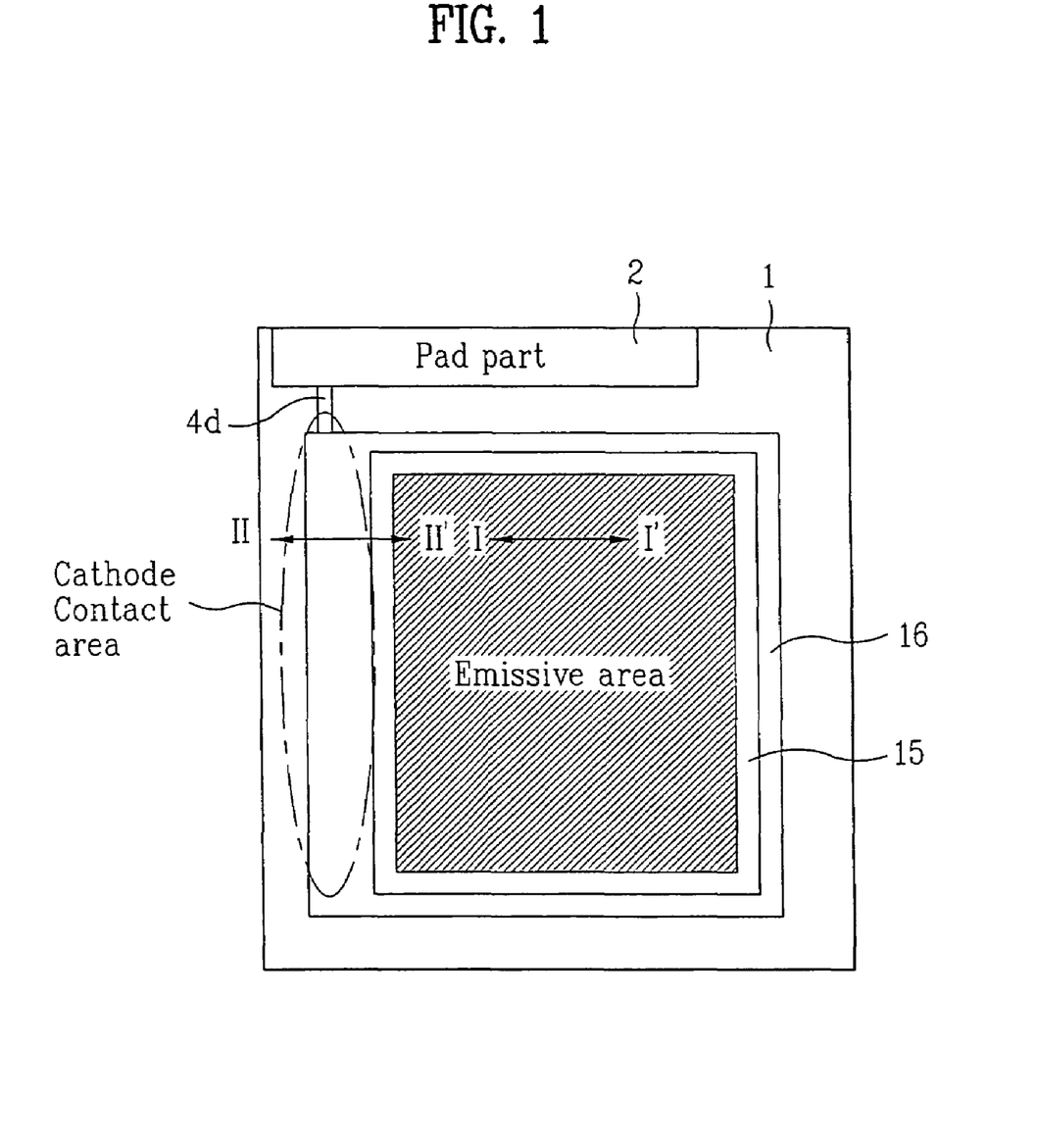
FIG. 1 illustrates a plane view of an active matrix electroluminescence device according to the present invention.

FIG. 1 illustrates a plane view of an active matrix electroluminescence device according to the present invention.

Referring to FIG. 1, an emissive area and a non-emissive area are defined on a substrate 1. A plurality of emissive pixels is formed in the emissive area. A pad part 2, a common electrode contact wire 4d connected to the pad part 2, and circuits, such as a gate driver and a data driver, are formed in the non-emissive area. In the present invention, the pixel electrode (i.e., the ITO layer) and the common electrode (i.e., cathode) 16 are formed not to be in direct contact with each other, when formed on the wire or the electrode in the non-emissive area.

First Embodiment

FIGS. 2A to 2E illustrate cross-sectional views showing the process steps of a method for fabricating the active matrix electroluminescence device according to a first embodiment of the present invention.

Figure 2A:
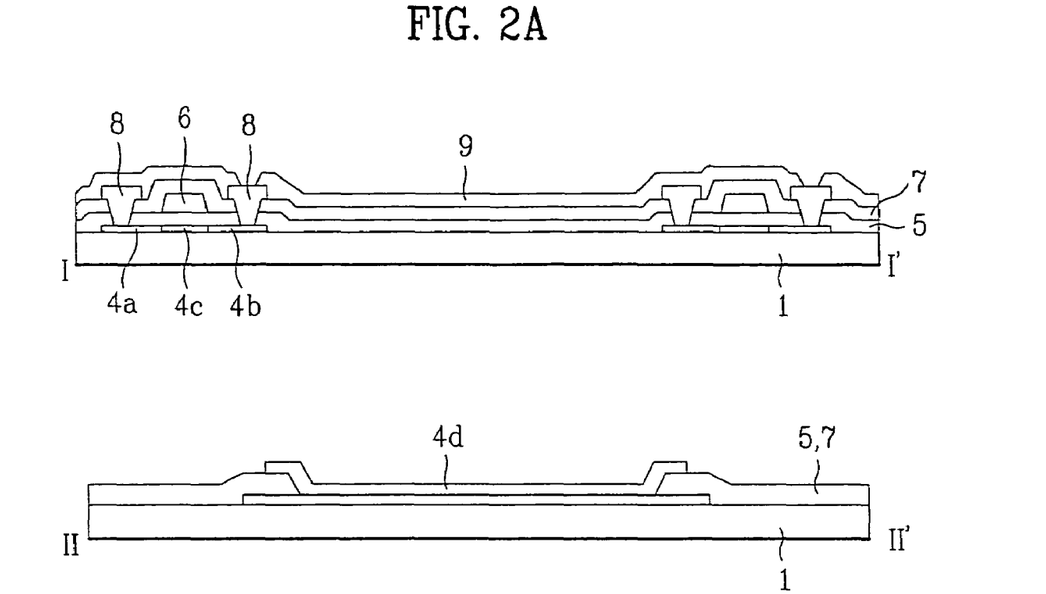
FIGS. 2A to 2E illustrate cross-sectional views showing the process steps of a method fabricating the active matrix electroluminescence device according to a first embodiment of the present invention.

Referring to FIG. 2A, in order to form source and drain electrodes 4a and 4b in the emissive area, and a wire 4d electrically connecting the pad part 2 and the common electrode in the non-emissive area, a metallic material layer is formed on a glass substrate 1, which is then selectively removed. The metallic material layer is formed of any one of or an alloy of molybdenum (Mo), aluminum (Al), and neodymium (Nd).

Subsequently, a gate insulating layer 5 is formed on the entire surface. More specifically, the gate insulating layer 5 is formed on the substrate 1, the source and drain electrodes 4a and 4b, a channel 4c, and the wire 4d. Then, a gate electrode 6 is formed at a predetermined area of the gate insulating layer 5 being aligned with the channel 4c. The source and drain electrodes 4a and 4b, the channel 4c, and the gate electrode 6 form a thin film transistor switching each pixel in the emissive area.

An interlayer dielectric 7 is formed on the gate insulating layer 5 and the gate electrode 6. Then, the gate insulating layer 5 and the gate electrode 6 are selectively removed, so as to form a plurality of contact holes exposing a portion of the surface of the source and drain electrodes 4a and 4b. At this point, a trench is formed on the gate insulating layer 5 and the interlayer dielectric 7 in the non-emissive area, so as to expose the wire 4d. Thereafter, the contact holes are filled with a metal, thereby forming a plurality of electrode lines 8 each electrically connected to the source and drain electrodes 4a and 4b.

Subsequently, an insulating material, such as a $SiN_x$ group material or a $SiO_x$ group material, is deposited on the entire surface of the interlayer dielectric 7 and the electrode lines 8, so as to form a protective layer 9. Then the protective layer 9 is selectively removed, thereby exposing the electrode line 8 connected to the drain electrode 4b in the emissive area. At this point, the protective layer 9 formed on the wire 4d is also removed.

The gate insulating layer 5, the interlayer dielectric 7, and the protective layer 9 in the non-emissive area can also be etched simultaneously, so as to form the trench exposing the wire 4d.

Figure 2B:
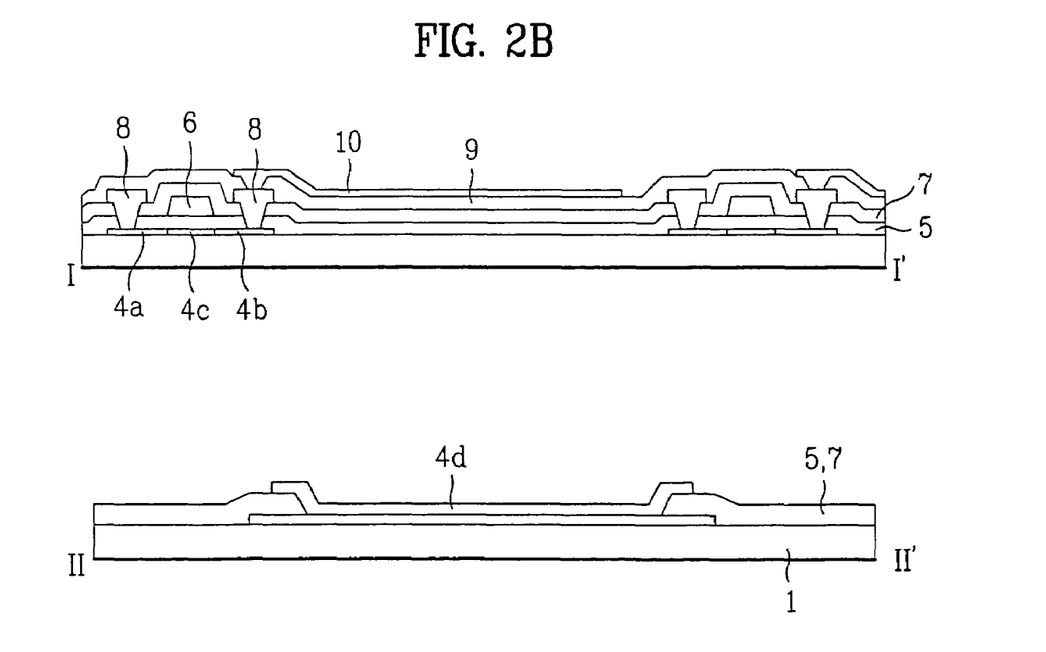

Referring to FIG. 2B, in order to form a pixel electrode 10 in the emissive area, a metallic material is deposited on the protective layer 9, which is then selectively removed. In the bottom-emission ELD, the pixel electrode 10 is formed of a transparent material, such as indium tin oxide (ITO). Conversely, in the top-emission ELD, the pixel electrode is formed of a metal having high reflectivity and work function. Since the bottom-emission ELD is given as an example in the present invention, the pixel electrode 10 is formed of an ITO layer. The ITO layer 10 is formed only in the pixel area within the emissive area, but the ITO layer 10 is not formed on the wire 4d of the non-emissive area. The etchant used for removing the ITO layer 10 deposited on the wire 4d of the non-emissive area. However, the etchant used herein should not corrode the substance of the wire 4d.

Figure 2C:
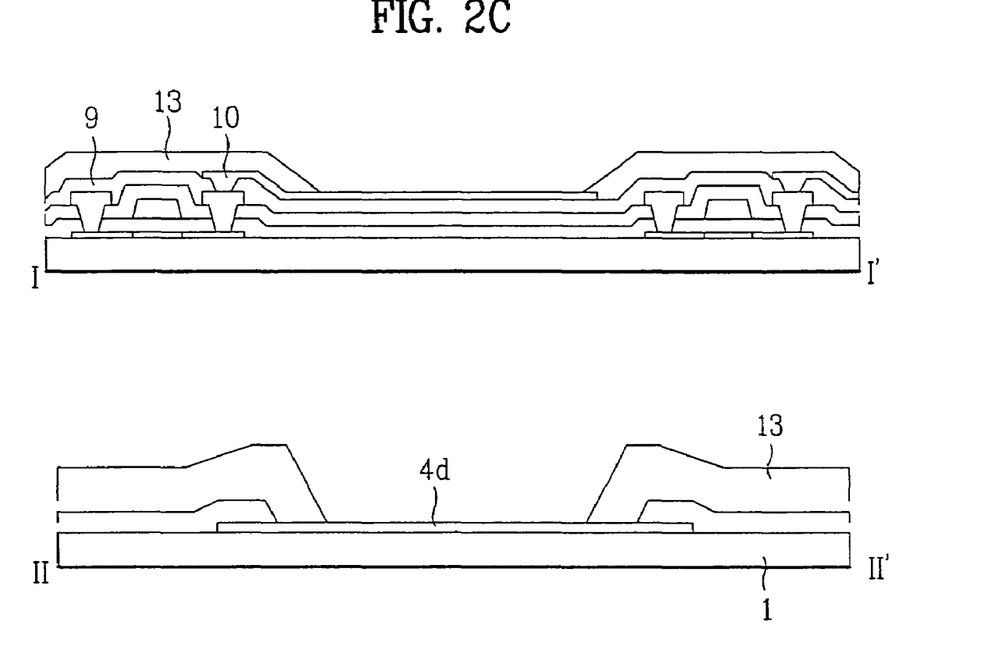

Thereafter, as shown in FIG. 2C, an insulating layer 13 is deposited on the entire surface of the protective layer 9 and the pixel electrode 10. Then, the insulating layer 13 is selectively removed, so as to expose a portion of the pixel electrode 10 and the wire 4d. Herein, the insulating layer 13 forms a boundary area between the pixel areas in the emissive area.

Figure 2D:
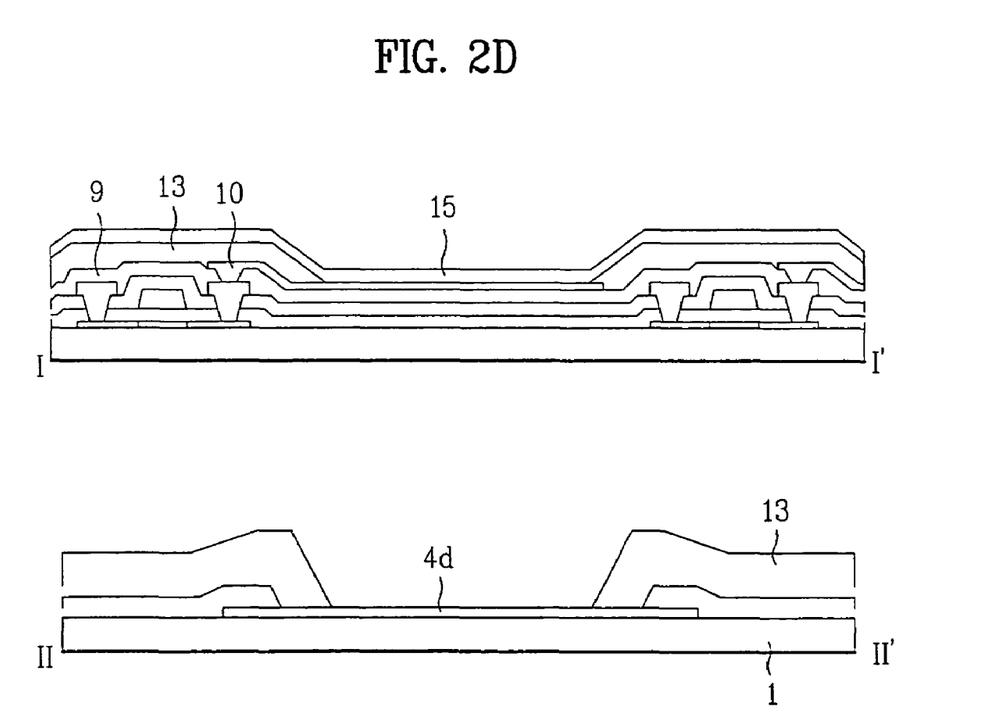

Referring to FIG. 2D, a shadow mask (not shown) is used to deposit an organic electroluminous layer 15 on the pixel electrode 10. At this point, the organic electroluminous layer 15 is not formed on the non-emissive layer. The organic electroluminescent layer 15 is classified into a red (R) organic electroluminous layer, a green (G) organic electroluminous layer, and a blue (B) organic electroluminous layer depending upon the emitted color. And, the R, G, and B organic electroluminous layers are serially formed in the corresponding pixel area. Herein, the organic electroluminous includes an organic layer (not shown), a hole injecting layer (not shown) and a hole transport layer (not shown) for injecting and transporting holes supplied from the pixel electrode 10 into the organic layer, respectively, and an electron injecting layer (not supplied from the common electron transport layer (not shown) for injecting and transporting electrons supplied from the common electrode into the organic layer, respectively.

Figure 2E:
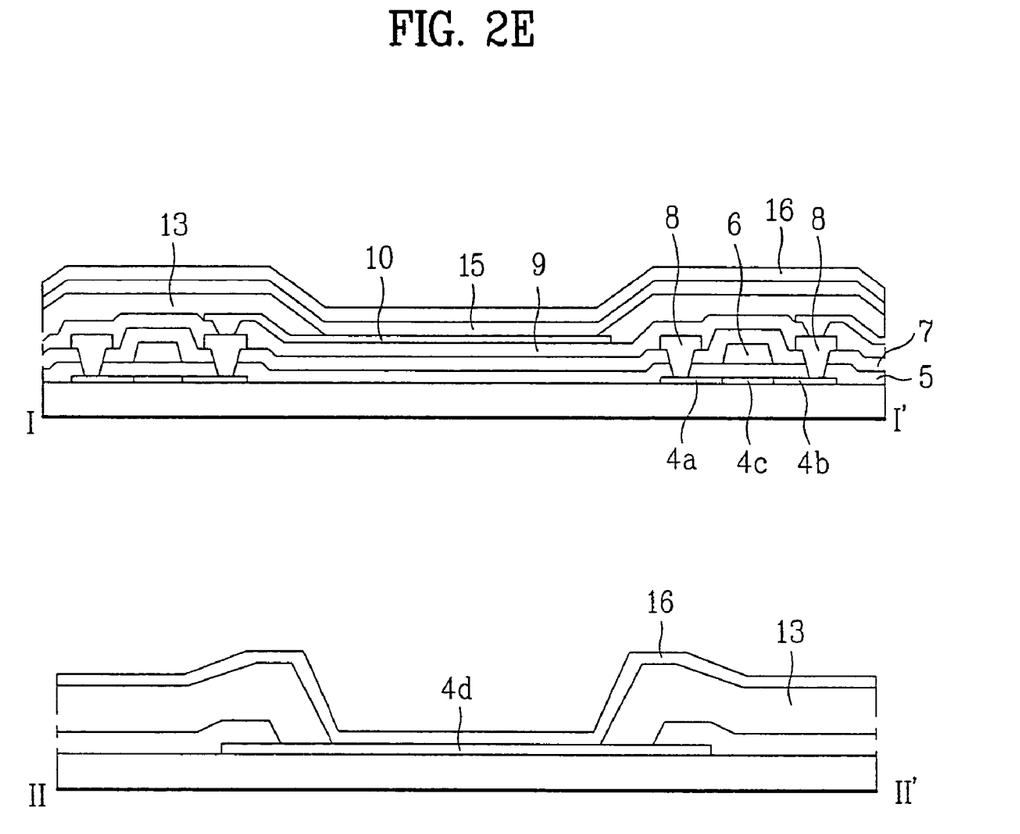

Referring to FIG. 2E, an aluminum (Al) layer or an aluminum alloy layer is deposited on the entire surface of the organic electroluminous layer 15, so as to form the common electrode 16. The common electrode 16 is formed on the organic electroluminous layer 15 in the emissive area, and on the wire 4d and the insulating layer 13 in the non-emissive area. Therefore, the common electrode 16 is in direct contact with the wire 4d.

Although not shown in the drawings, a protective layer (not shown) is formed, in a later process, so as to protect the organic electroluminous layer 15 from oxygen and moisture. Then, a sealant (not shown) and a transparent substrate are used to form a protective cap.

Second Embodiment

FIGS. 3A to 3E illustrate cross-sectional views showing the process steps of a method for fabricating the active matrix electroluminescence device according to a second embodiment of the present invention.

Figure 3A:
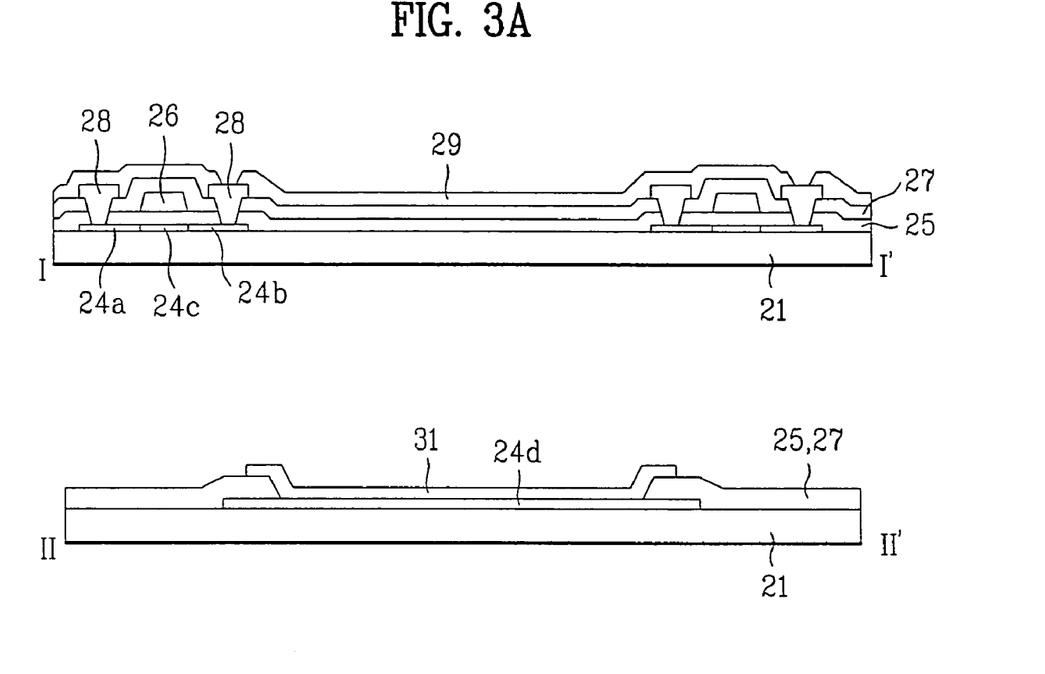
FIGS. 3A to 3E illustrate cross-sectional views showing the process steps of a method for fabricating the active matrix electroluminescence device according to a second embodiment of the present invention.

Referring to FIG. 3A, in order to form source and drain electrodes 24a and 24b in the emissive area, and a wire 24d electrically connected to the common electrode in the non-emissive area, a metallic material layer is formed on a glass substrate 21, which is then selectively removed. The metallic material layer is formed of any one of or an alloy of molybdenum (Mo), aluminum (Al), and neodymium (Nd).

Subsequently, a gate insulating layer 25 is formed on the entire surface. More specifically, the gate insulating layer 25 is formed on the substrate 21, the source and drain electrodes 24a and 24b, a channel 24c, and the wire 24d. Then, a gate electrode 26 is formed at a predetermined area of the gate insulating layer 25 being aligned with the channel 24c. The source and drain electrodes 24a and 24b, the channel 24c, and the gate electrode 26 form a thin film transistor switching each pixel in the emissive area.

An interlayer dielectric 27 is formed on the gate insulating layer 25 and the gate electrode 26. Then, the gate insulating layer 25 and the gate electrode 26 are selectively removed, so as to form a plurality of contact holes exposing a portion of the surface of the source and drain electrodes 24a and 24b. At this point, a trench is formed on the interlayer dielectric 27 and the gate insulating layer 25 in the non-emissive area, so as to expose the wire 24d.

Thereafter, the contact holes are filled with a metal, thereby forming a plurality of electrode lines 28 each electrically connected to the source and drain electrodes 24a and 24b. Also, a buffer metal layer 31 is formed on the wire 24d in the non-emissive area. The buffer metal layer 31 is formed either after forming the electrode lines 28 and the protective layer 29, or at the same time the electrode lines 28 are formed. When the buffer electrode layer 31 and the electrode lines 28 are formed simultaneously, the buffer metal layer 31 is formed of the same material as the electrode lines 28. Herein, the buffer electrode layer 31 is formed of a metal that is not corroded by an ITO etchant, such as any one of chrome (Cr), copper (Cu), tungsten (W), gold (Au), nickel (Ni), silver (Ag), titanium (Ti), tantalum (Ta), or an alloy of any of the same.

Subsequently, an insulating material, such as a $SiN_x$ group material or a $SiO_x$ group material, is deposited on the entire surface of the gate electrode 26, the interlayer dielectric 27, and the electrode lines 28, so as to form a protective layer 29. Then the protective layer 29 is selectively removed, thereby exposing the electrode line 28 connected to the drain electrode 24b in the emissive area. At this point, when the protective layer 29 is formed after forming the buffer metal layer 31, the protective layer 29 formed on the buffer metal layer 31 is also removed.

Figure 3B:
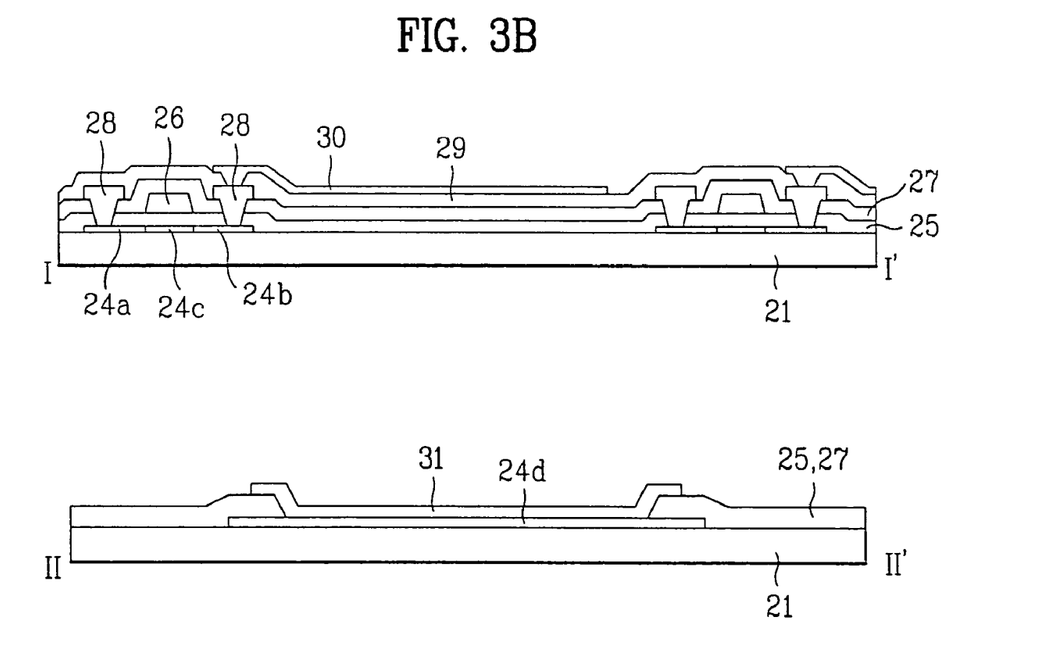

Referring to FIG. 3B, an ITO layer is formed on the protective layer 29 in order to form the pixel electrode 30 in the emissive area, and then, the ITO layer is selectively removed. The etchant used to remove the ITO layer 30, which is deposited in the non-emissive area, may be corrosive to the material of the wire 24d. Since the buffer metal layer 31 is formed on the wire 24d, the buffer metal layer 31 can protect the wire 24d from corrosion. The ITO layer 30 is formed only in the pixel area within the emissive area and is not formed in the non-emissive area.

Figure 3C:
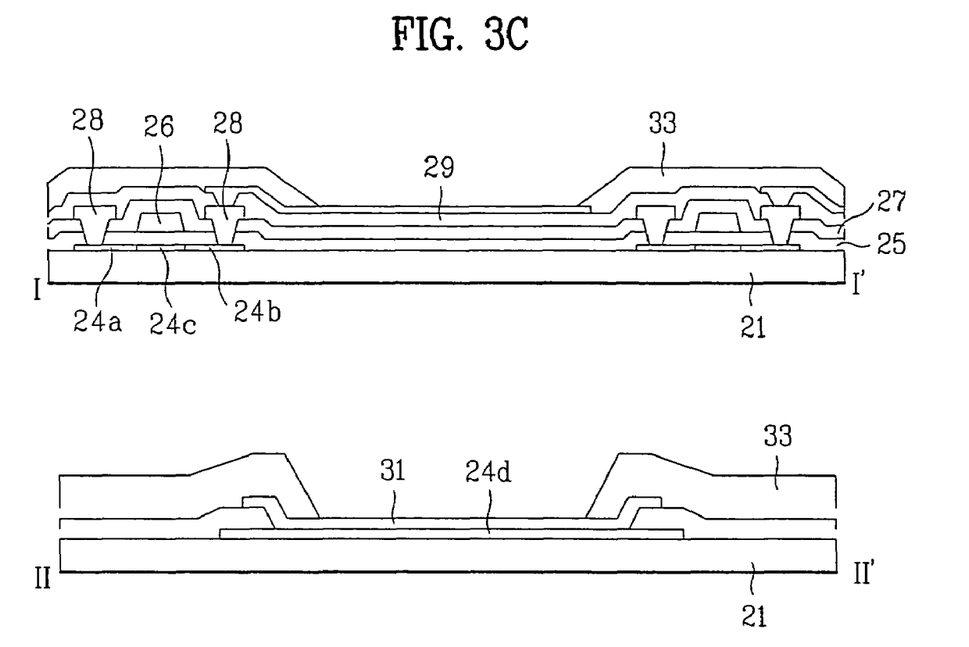

Further, as shown in FIG. 3C, after depositing the insulating layer 33 on the entire surface of the protective layer 29 and the pixel electrode 30, the insulating layer 33 is selectively removed so as to expose a portion of the pixel electrode 30 and the buffer metal layer 31. The insulating layer 33 forms a boundary area between the pixel areas in the emissive area.

Figure 3D:
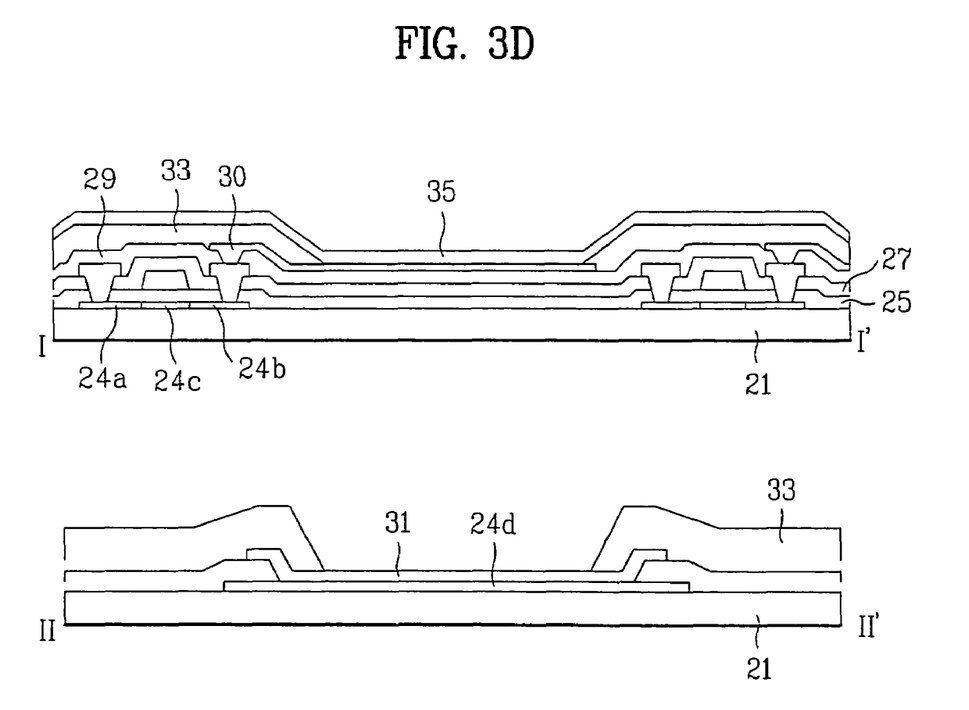

Referring to FIG. 3D, a shadow mask (not shown) is used to deposit an organic electroluminous layer 35 on the pixel electrode 30. At this point, the organic electroluminous layer 35 is not formed on the non-emissive layer.

Figure 3E:
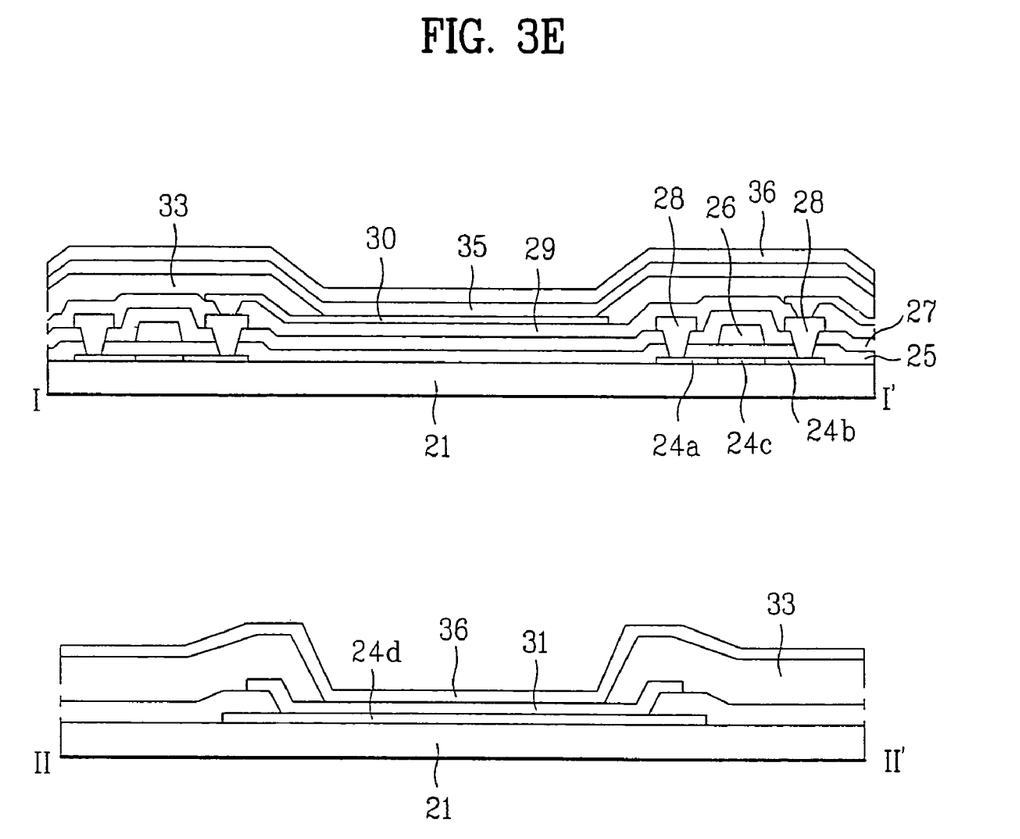

Referring to FIG. 3E, a common electrode 36 is formed on the entire surface of the organic electroluminous layer 35. The common electrode 36 is formed on the organic electroluminous layer 35 in the emissive area, and on the buffer metal layer 31 and the insulating layer 33 in the non-emissive area. Accordingly, the common electrode 36 is not in direct contact with the wire 24d. Instead, the common electrode 36 is electrically connected to the wire 24d through the buffer metal layer 31.

Although not shown in the drawings, a protective layer (not shown) is formed, in a later process, so as to protect the organic electroluminous layer 35 from oxygen and moisture. Then, a sealant (not shown) and a transparent substrate are used to form a protective cap.

As described above, in the active matrix electroluminescence device and the method for fabricating the same, either the ITO layer is not formed on the wire or electrode that contacts the common electrode from the outside of the emissive layer, or, alternatively, another metal layer is formed instead of the ITO layer, thereby preventing changes in the interfacial characteristic caused by the ITO layer.

It will be apparent to those skilled in the art that various modifications and variations be made in the present invention without departing from the spirit or scope of the inventions. Thus, it is intended that the present invention covers the modifications and variations of this invention provided they come within the scope of the appended claims and their equivalents.

What is claimed is:

1. An active matrix electroluminescence device, comprising:
- transistors formed on an emissive area of a substrate;
- a wire formed on a non-emissive area of the substrate;
- a first insulating layer formed in direct contact with an edge of the wire to expose a top surface of a central portion of the wire in the non-emissive area;
- a first electrode formed on the first insulating layer in the enmissive area;
- an electroluminous layer formed on the first electrode; and
- a second electrode formed on the electroluminous layer and in direct contact with the top surface of the central portion of the wire exposed by the first insulating layer, wherein the first electrode is one of an anode or a cathode and the second electrode is the other of the anode or the cathode.

2. The device according to claim 1, wherein a trench is formed in the first insulating layer for exposing at least the top surface of the central portion of the wire in the non-emissive area.

3. The device according to claim 1, wherein the wire is formed of at least one of molybdenum (Mb), aluminum (Al), or neodymium (Nd).

4. The device according to claim 1, wherein the wire is connected to a pad part.

5. The device according to claim 1, wherein the first electrode is formed of indium tin oxide (ITO).

6. The device according to claim 1, wherein the first electrode is connected to the transistor in the emissive area through a contact hole penetrating through the first insulating layer.

7. The device according to claim 1, wherein the second electrode is formed of one of aluminum (Al) or an aluminum alloy.

8. The device according to claim 1, further comprising:
- at least one of a second insulating layer or a dielectric layer formed in direct contact with the edge of the wire, wherein the first insulating layer is formed over and in contact with said at least one of the second insulating layer or the dielectric layer.

9. The device according to claim 1, wherein the wire is formed in a first direction and the second electrode is formed in a second direction different from the first direction.

10. The device according to claim 9, wherein the first direction is at least substantially perpendicular to the second direction.

11. The device according to claim 1, wherein the wire is formed on only one level in the non-emissive area of the substrate.

12. An active matrix electroluminescence device, comprising:
- transistors formed on an emissive area of substrate;
- a wire formed on a non-emissive area of the substrate;
- a metal layer formed directly on a top surface of central portion of the wire:
- a first insulating layer formed in contact with an edge of the metal layer to expose a top surface of a central portion of the metal layer in the non-emissive area;
- a first electroluminous layer formed on the first electrode; and
- a second electrode formed on the electroluminous layer and in direct contract with the top surface of the central portion of the metal layer exposed by the first insulating layer, wherein:
- the metal layer is formed between the wire and the second electrode,
- the second electrode is electrically coupled to the top surface of the central portion of the wire through the metal layer, and
- the first electrode is one of an anode or a cathode and the second electrode is the other of the anode or the cathode.

13. The device according to claim 12, wherein the metal layer is formed of at least one of chrome (Cr), copper (Cu), tungsten (W), gold (Au), nickel(Ni), silver (Ag), titanium (Ti), or tantalum(Ta).

14. The device according to claim 12, further comprising:
- at least one of a second insulating layer or a dielectric layer formed in direct contact with the edge of the wire, wherein the first insulating layer is formed over and at least partially in contact with said at least one of the second insulating layer or the dielectric layer and, wherein the metal layer is formed between the first insulating layer and said at least one of the second insulating layer or dielectric layer.

15. The device according to claim 12, wherein the metal layer is formed as a single layer.

16. An active matrix electroluminescence device, comprising:
- a substrate;
- a wire formed on a non-emissive area of the substrate;
- an electrode that directly contacts a top surface of a area of the wire; and
- a plurality of insulating layers, wherein at least one of the insulating layers is in direct contact with an edge of the wire to expose the top surface of said area of the wire that is in direct contact with the electrode in the non-emissive area.

17. The device of claim 16, wherein the electrode is a cathode.

* * * * *